(12) United States Patent
Zha

(10) Patent No.: US 8,648,641 B2
(45) Date of Patent: Feb. 11, 2014

(54) VOLTAGE CONTROLLED VARIABLE RESISTOR SUITABLE FOR LARGE SCALE SIGNAL APPLICATION

(71) Applicant: STMicroelectronics (Shenzhen) R&D Co. Ltd., Shenzhen (CN)

(72) Inventor: Gang Zha, Shenzhen (CN)

(73) Assignee: STMicroelectronics (Shenzhen) R&D Co. Ltd., Shenzhen (CN)

( * ) Notice: Subject to any disclaimer, the term of this patent is extended or adjusted under 35 U.S.C. 154(b) by 0 days.

(21) Appl. No.: 13/678,782

(22) Filed: Nov. 16, 2012

(65) Prior Publication Data

US 2013/0141152 A1 Jun. 6, 2013

(30) Foreign Application Priority Data

Dec. 1, 2011 (CN) .......................... 2011 1 0405368

(51) Int. Cl.
*H03L 5/00* (2006.01)
(52) U.S. Cl.
USPC ........................................ 327/308; 333/81 R

(58) Field of Classification Search
USPC ................................ 327/306, 308; 333/81 R
See application file for complete search history.

(56) References Cited

U.S. PATENT DOCUMENTS

| | | | | |
|---|---|---|---|---|
| 5,300,834 A | * | 4/1994 | Bret | 327/581 |
| 5,703,588 A | * | 12/1997 | Rivoir et al. | 341/159 |
| 6,522,116 B1 | * | 2/2003 | Jordan | 323/288 |
| 6,522,175 B2 | * | 2/2003 | Ueno et al. | 327/103 |
| 8,159,285 B2 | * | 4/2012 | Hioka et al. | 327/543 |

* cited by examiner

*Primary Examiner* — Dinh T. Le
(74) *Attorney, Agent, or Firm* — Gardere Wynne Sewell LLP

(57) ABSTRACT

A voltage controlled variable resistor circuit is configured to variably attenuate a variable source signal. A fixed attenuation circuit is coupled to receive the variable source signal and output an attenuated variable source signal. The variable source signal is further applied across a variable resistive divider formed of a fixed resistive circuit and a variable resistive circuit. The variable resistive circuit has a first input configured to receive the attenuated variable source signal and a second input configured to receive a variable resistance control signal. The variable resistive circuit is configured to have a resistance which is variable in response to the attenuated variable source signal and the variable resistance control signal.

16 Claims, 3 Drawing Sheets

VOLTAGE CONTROLLED VARIABLE RESISTOR SUITABLE FOR LARGE SCALE SIGNAL APPLICATION

PRIORITY CLAIM

The present application claims priority from Chinese Application for Patent No. 201110405368.2 filed Dec. 1, 2011, the disclosure of which is hereby incorporated by reference.

TECHNICAL FIELD

The present invention relates to circuits and in particular to variable resistor circuits.

BACKGROUND

The voltage controlled variable resistor is a very useful component in the design of many applications, for example, the voltage controlled gain cell, AGC circuit, automatic gain control, and the like.

Reference is now made to FIG. 1 which shows a diagram of a prior art voltage controlled variable resistor circuit 10. The circuit 10 is implemented using a forward biased diode 12. The circuit 10 may typically be used in an RF application as an automatic gain control (AGC) circuit. The diode 12 is typically a PIN diode configured for use as a variable resistor. The equivalent resistance is controlled by the current through the diode 12. Equation 1 presents the diode voltage:

$$V_D = V_T \cdot \ln \frac{I_D}{I_S}$$

Equation 2 presents the diode resistance:

$$r_D = \frac{\partial V_D}{\partial I_D}$$
$$= V_T \cdot \frac{I_S}{I_D} \cdot \frac{1}{I_S}$$
$$= \frac{V_T}{I_D}$$

A problem with the circuit 10 of FIG. 1 is that the circuit 10 can be only used in small signal condition (in the range of mV or μV). With a large signal voltage, however, the equation of $r_D$ is no longer valid and a large distortion in the signal is introduced.

Reference is now made to FIG. 2 which shows a diagram of a prior art voltage controlled variable resistor circuit 20. The circuit 20 is implemented using a MOS transistor 22 operating in the triode region. In the triode region, the I/V characteristic of the MOS transistor 22 looks like a voltage ($V_{GS}$) controlled variable resistor. The equivalent resistance is given by Equation 3:

$$R_{EQ} = \frac{1}{K \cdot \frac{W}{L}(V_{GS} - V_{TH})}$$

In order to guarantee linearity with respect to the equivalent resistance, the voltage between the source and drain of the MOS transistor 22 must be kept very small (for example, tens of mV). This circuit 20 of FIG. 2 accordingly suffers from the same problem as circuit 10 of FIG. 1.

Reference is now made to FIG. 3 which shows a diagram of a prior art voltage controlled variable resistor circuit 30. The circuit 30 is implemented using a plurality of series connected resistors 32. A plurality of switches (for example, MOS devices) 34 are coupled to selectively shunt around one or more of the resistors 32 so as to change the end-to-end resistance value of the circuit 30. The switches 34 are digitally controlled. This type of variable resistor circuit 30 is suitable for use with large signal levels. However, because of the digital control, the resistance variation is discontinuous.

There is a need in the art for a voltage controlled variable resistor suitable for continuous and linear resistance variation and use with large scale signals.

SUMMARY

A voltage controlled variable resistor circuit comprises a fixed attenuation circuit configured to receive a source signal at a first reference node and output an attenuated source signal; an operational amplifier circuit configured to receive the attenuated source signal and a feedback signal and generate a first control signal; a first transistor having a control terminal configured to receive the first control signal, a first conduction terminal configured to generate an output signal and a second conduction terminal configured to generate the feedback signal; and a second transistor coupled between the second conduction terminal and a second reference node and having a control terminal configured to receive a second control signal.

A voltage controlled variable resistor circuit comprises: a fixed attenuation circuit coupled between a first reference node and a second reference node that are configured to receive a variable source signal, said attenuation circuit configured to output an attenuated variable source signal; a fixed resistive circuit; a variable resistive circuit, wherein the fixed resistive circuit and variable resistive circuit are coupled in series at an output node between the first reference node and the second reference node; and said variable resistive circuit having a first input configured to receive the attenuated variable source signal and a second input configured to receive a variable resistance control signal, said variable resistive circuit having a resistance which is variable in response to the attenuated variable source signal and the variable resistance control signal.

A voltage controlled variable resistor circuit comprises: first and second reference nodes across which a variable source signal is to be applied; a first resistor; a second resistor; wherein the first and second resistors are connected in series at a first node between the first and second reference nodes; an operational amplifier having a first input connected to the first node and a second input connected to a feedback node; a third resistor connected between the first reference node and an output node; a first transistor having first control terminal connected to an output of the operational amplifier and having a first conduction terminal connected to the output node and having a second conduction terminal connected to the feedback node; and a second transistor having a second control terminal configured to received a variable resistance control signal and having a first conduction terminal connected to the feedback node and a second conduction terminal connected to the second reference node.

BRIEF DESCRIPTION OF THE DRAWINGS

For a better understanding of the embodiments, reference will now be made by way of example only to the accompanying figures in which.

DETAILED DESCRIPTION OF THE DRAWINGS

To address the deficiencies of the prior art voltage controlled variable resistor circuits discussed above, a voltage controlled variable resistor circuit is presented with continuous resistance variation and a capability of operation with large scale signal levels.

Figure 1:
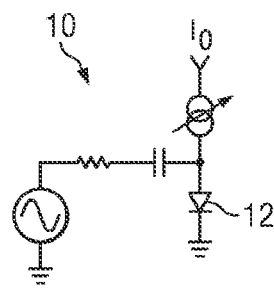
FIG. 1 shows a prior art voltage controlled variable resistor circuit.
Figure 2:
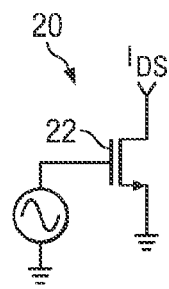
FIG. 2 shows a prior art voltage controlled variable resistor circuit.
Figure 3:
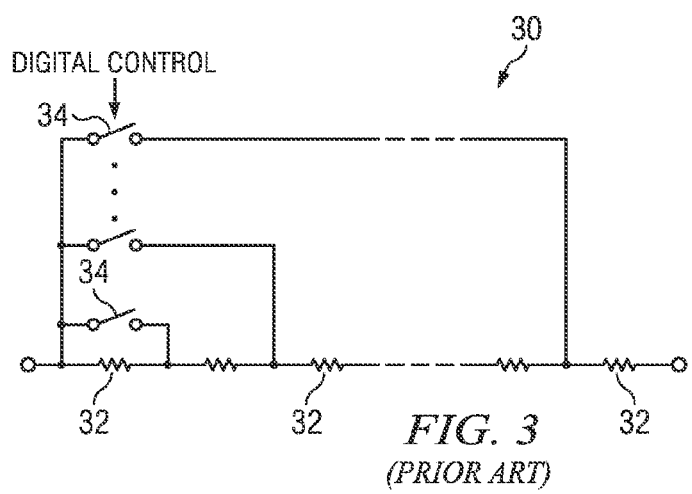
FIG. 3 shows a prior art voltage controlled variable resistor circuit.
Figure 4:
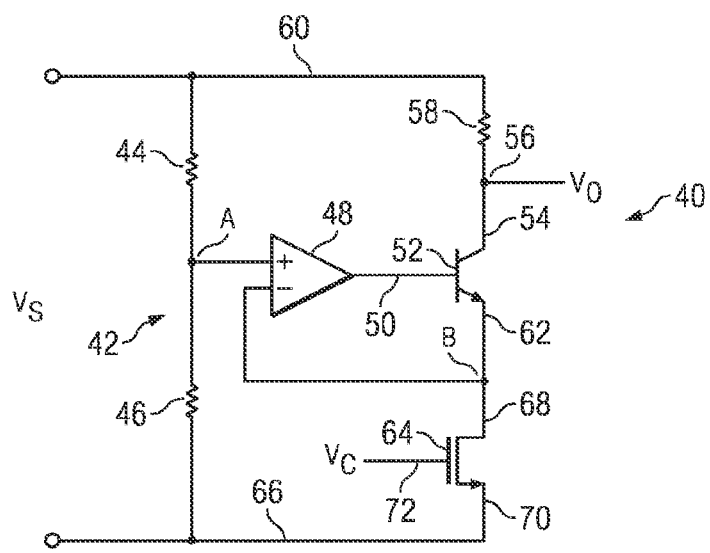
FIG. 4 shows a voltage controlled variable resistor circuit.

Reference is now made to FIG. 4 which shows a diagram of a voltage controlled variable resistor circuit 40. The circuit 40 includes a fixed voltage divider 42 formed by resistors 44 and 46. A variable source signal voltage $V_S$ is applied to reference nodes 60 and 66 and across the voltage divider 42. The fixed voltage divider 42 is used to generate an attenuated source signal voltage at node A. The circuit 40 further includes an operational amplifier 48 (although any other suitable differential input amplifier could alternatively be used). A first (positive) input of the operational amplifier 48 receives the attenuated source signal voltage from node A. The output of the operational amplifier 48 is applied to the control terminal 50 of a first transistor 52. This first transistor 52 may, in a preferred embodiment, comprise a bi-polar device wherein the control terminal 50 is the base of the bi-polar transistor. A first conduction terminal 54 (for example, the collector) of the first transistor 52 defines an output node 56 producing an output voltage $V_O$. A resistor 58 is coupled between the first conduction terminal 54 (output node 54) and a first reference terminal 60 of the source signal voltage $V_S$. A second conduction terminal 62 (for example, the emitter) of the first transistor 52 defines a feedback node B. A second (negative) input of the operational amplifier 48 is coupled to the feedback node B. A second transistor 64 is coupled between the feedback node B and a second reference terminal 66 of the source signal voltage $V_S$. This second transistor 64 may, in a preferred embodiment, comprise a MOS device with the source-drain path coupled between the feedback node B and a second reference terminal 66. Specifically, drain terminal 68 is coupled to the feedback node B and a source terminal 70 is coupled to the second reference terminal 66. A control terminal (the gate) 72 of the second transistor 64 receives a voltage control signal $V_C$.

The attenuated source signal voltage produced at node A by the voltage divider 42 is applied to the drain terminal 68 of the second (MOS) transistor 64 at node B via the operational amplifier 48 and the first (bi-polar) transistor 52. The values of the resistors 44 and 46 in the voltage divider 42 are selected to attenuate the signal $V_S$ to a level around tens of mV peak voltage. This is preferred so as to ensure that the second (MOS) transistor 64 works in the triode region with good linearity.

The resistor 58 and transistors 52 and 64 essentially form a variable resistive voltage divider coupled between reference nodes 60 and 66 and configured to variably attenuate the source signal voltage $V_S$ for output at the output node 56 in response to the input attenuated source signal voltage from node A and the input voltage control signal $V_C$. As the input voltage control signal $V_C$ increases in magnitude the effective resistance of the transistors 52 and 64 between the output node 56 and the reference node 66 decreases. This causes a corresponding decrease in the magnitude of the variably attenuated source signal voltage $V_S$ presented at the output node 56.

The Equations which describe operation of the circuit of FIG. 4 are as follows:

$$V_{DS} = V_S \cdot \frac{R_B}{R_A + R_B}$$

$$I_{DS} = \frac{V_{DS}}{\dfrac{1}{K \cdot \dfrac{W}{L} \cdot (V_{GS} - V_{TH})}}$$

$$= V_S \cdot \frac{R_B}{R_A + R_B} \cdot K \cdot \frac{W}{L} \cdot (V_{GS} - V_{TH})$$

$$R_{EQ} = \frac{V_S}{I_{DS}} - R1$$

$$= \frac{R_A + R_B}{R_B} \cdot \frac{1}{K \cdot \dfrac{W}{L} \cdot (V_{GS} - V_{TH})} - R1$$

$$\frac{V_O}{V_S} = \frac{R_{EQ}}{R1 + R_{EQ}}$$

$$= 1 - \frac{R_B}{R_A + R_B} \cdot R1 \cdot K \cdot \frac{W}{L} \cdot (V_{GS} - V_{TH})$$

Where $V_{GS}=V_C$ (refer to reference voltage) in FIG. 4 and where $R_A$ is the resistance of resistor 44, $R_B$ is the resistance of resistor 46 and R1 is the resistance of resistor 58.

Although not shown explicitly in FIG. 4, the circuit 40 may further include a fixed resistor coupled between the output node 56 and the reference node 66.

Figure 5A:
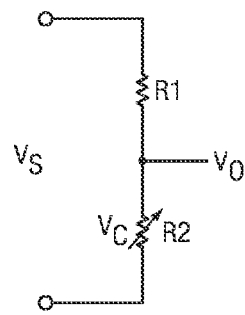
FIG. 5A is a simplified equivalent schematic of the circuit shown in FIG. 4.

FIG. 5A is a simplified equivalent schematic of the circuit 40 shown in FIG. 4. The circuit is essentially a variable voltage divider with a fixed resistor R1 (resistor 58 in FIG. 4) and a variable resistor R2 (formed by transistors 52 and 64 in FIG. 4) connected in series. The variation in resistor R2 (formed by transistors 52 and 64) is controlled by $V_C$.

Figure 5B:
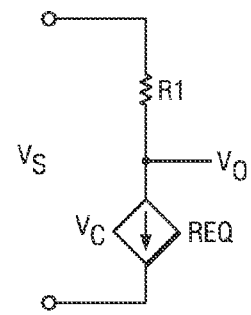
FIG. 5B is an equivalent representation of the simplified equivalent schematic of the circuit shown in FIG. 4.

FIG. 5B is an equivalent representation of the simplified equivalent schematic of the circuit 40 shown in FIG. 4. The variable resistor R2 is replaced by a variable voltage controlled current source (formed by transistors 52 and 64 in FIG. 4). The current of the current source is controlled by both source signal $V_S$ and the control voltage $V_C$. In this case, the equivalent resistance can be calculated as:

$$R_{EQ} = \frac{V_S}{I_{REQ}} - R1$$

$$= \frac{V_S}{g_m(V_C) \cdot V_S} - R1$$

$$= \frac{1}{g_m(V_C)} - R1$$

The circuit implementation in FIG. 4 has a limitation in that the voltage of source signal $V_S$ has to be positive (i.e., the voltage of node 60 is higher than the voltage of node 66). The reason for this is because the first (bipolar) transistor 52 can only pull current from resistor 58. $V_S$ is defined here as the voltage between reference nodes 60 and 66, where the voltage at node 66 is regarded as a reference voltage. For circuit 40, the voltage at node 60 has to be higher than the reference voltage (at node 66), and thus in this case, $V_S$ has to be positive.

Figure 6:
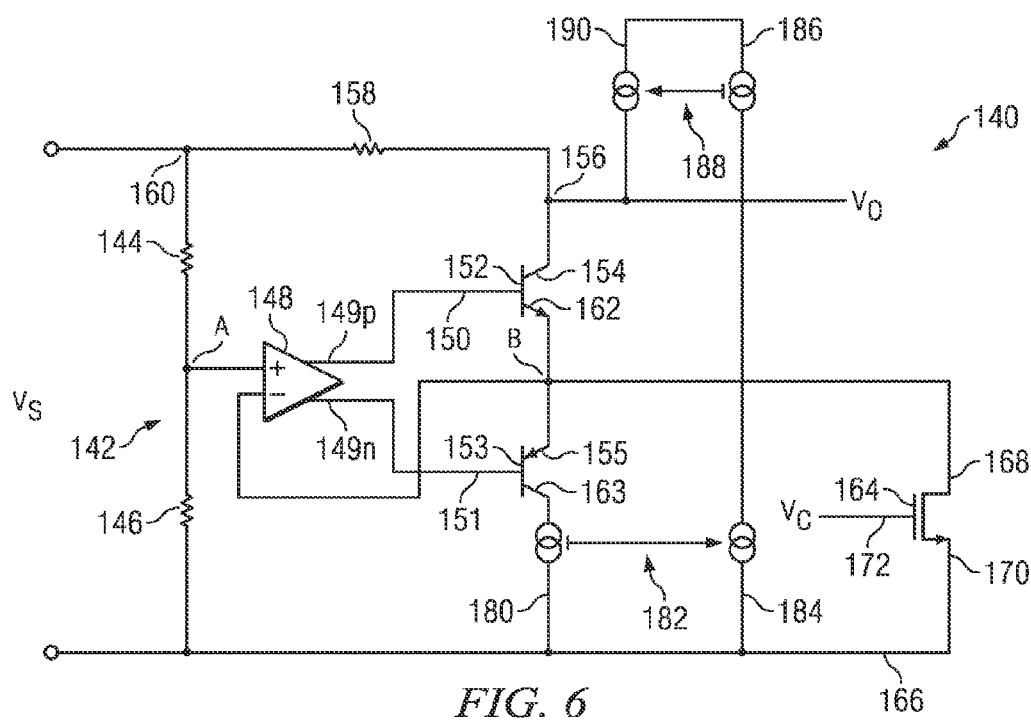
FIG. 6 shows a diagram of a voltage controlled variable resistor circuit.

Reference is now made to FIG. 6 which shows a diagram of a voltage controlled variable resistor circuit 140 that addresses the foregoing limitation associated with the circuit 40 of FIG. 4. The circuit 140 implements a complementary design. The circuit 140 includes a fixed voltage divider 142 formed by resistors 144 and 146. A source signal voltage $V_S$ is applied across the fixed voltage divider 142. The voltage divider 142 is used to generate an attenuated source signal voltage at node A. The circuit 140 further includes an operational amplifier 148. A first (positive) input of the operational amplifier 148 receives the attenuated source signal voltage from node A. The operational amplifier 148 has two output terminals with fixed level shift. In this context, the operational amplifier is not a differential output operational amplifier. Rather, the amplifier is configured such that the signals at the two output of the operational amplifier at the same signal but with a level shift of 2*V(BE) in between. A first output 149p is applied to the control terminal 150 of a first transistor 152. This first transistor 152 may, in a preferred embodiment, comprise a bi-polar device wherein the control terminal 150 is the base of the bi-polar transistor. A first conduction terminal 154 (for example, the collector) of the first transistor 152 defines an output node 156 producing an output voltage $V_O$. A resistor 158 is coupled between the first conduction terminal 154 and a first reference terminal 160 of the source signal voltage $V_S$. A second conduction terminal 162 (for example, the emitter) of the first transistor 152 defines a feedback node B. A second (negative) input of the operational amplifier 48 is coupled to the feedback node B. A second output 149n is applied to the control terminal 151 of a second transistor 153. This second transistor 153 may, in a preferred embodiment, comprise a bi-polar device wherein the control terminal 151 is the base of the bi-polar transistor. The first and second transistors 152 and 153 are of opposite conductivity types (NPN/PNP). A first conduction terminal 155 (for example, the emitter) of the second transistor 153 is coupled to the feedback node B. A second conduction terminal 163 (for example, the collector) of the second transistor 153 is coupled to a first leg 180 of a first current mirror circuit 182. A second leg 184 of the first current mirror circuit 182 is coupled to a first leg 186 of a second current mirror circuit 188. A second leg 190 of the second current mirror circuit 188 is coupled to the output node 156. The first and second current mirror circuits 182 and 188 are of conventional design well known to those skilled in the art and may be implemented using either bi-polar or MOS transistors.

A third transistor 164 is coupled between the feedback node B and a second reference terminal 166 of the source signal voltage $V_S$. This third transistor 164 may, in a preferred embodiment, comprise a MOS device with the source-drain path coupled between the feedback node B and a second reference terminal 166. Specifically, drain terminal 168 is coupled to the feedback node B and a source terminal 170 is coupled to the second reference terminal 166. A control terminal (the gate) 172 of the third transistor 164 receives a voltage control signal $V_C$.

Thanks to the symmetry structure of third (MOS) transistor 164, the source and drain of said third transistor 164 can be reversed depending on the voltage at node B (higher or lower than a voltage at the reference terminal 166). In this case, the current in the third transistor 164 can flow in both directions (up or down). Accordingly, the current can be pulled out from resistor 158 through the first (bi-polar) transistor 152 and the current can also be sourced into resistor 158 through second (bi-polar) transistor 153 and the first and second current mirror circuits 182 and 188.

So, the circuit implementation in FIG. 6 works with an AC input signal ($V_S$ can be positive or negative). When source signal is at its negative half cycle, the source of the third transistor 164 moves to point B. In this case, the $V_{GS}$ of transistor 164 becomes:

$$V_C - V_S \cdot \frac{R_B}{R_A + R_B}$$

instead of $V_C$ (where $R_A$ is the resistance of resistor 144 and $R_B$ is the resistance of resistor 146). This introduces some error into the control voltage. But, since:

$$V_S \cdot \frac{R_B}{R_A + R_B}$$

is designed to be very small compared to the control voltage $V_C$, such influence can be ignored.

Figure 7:
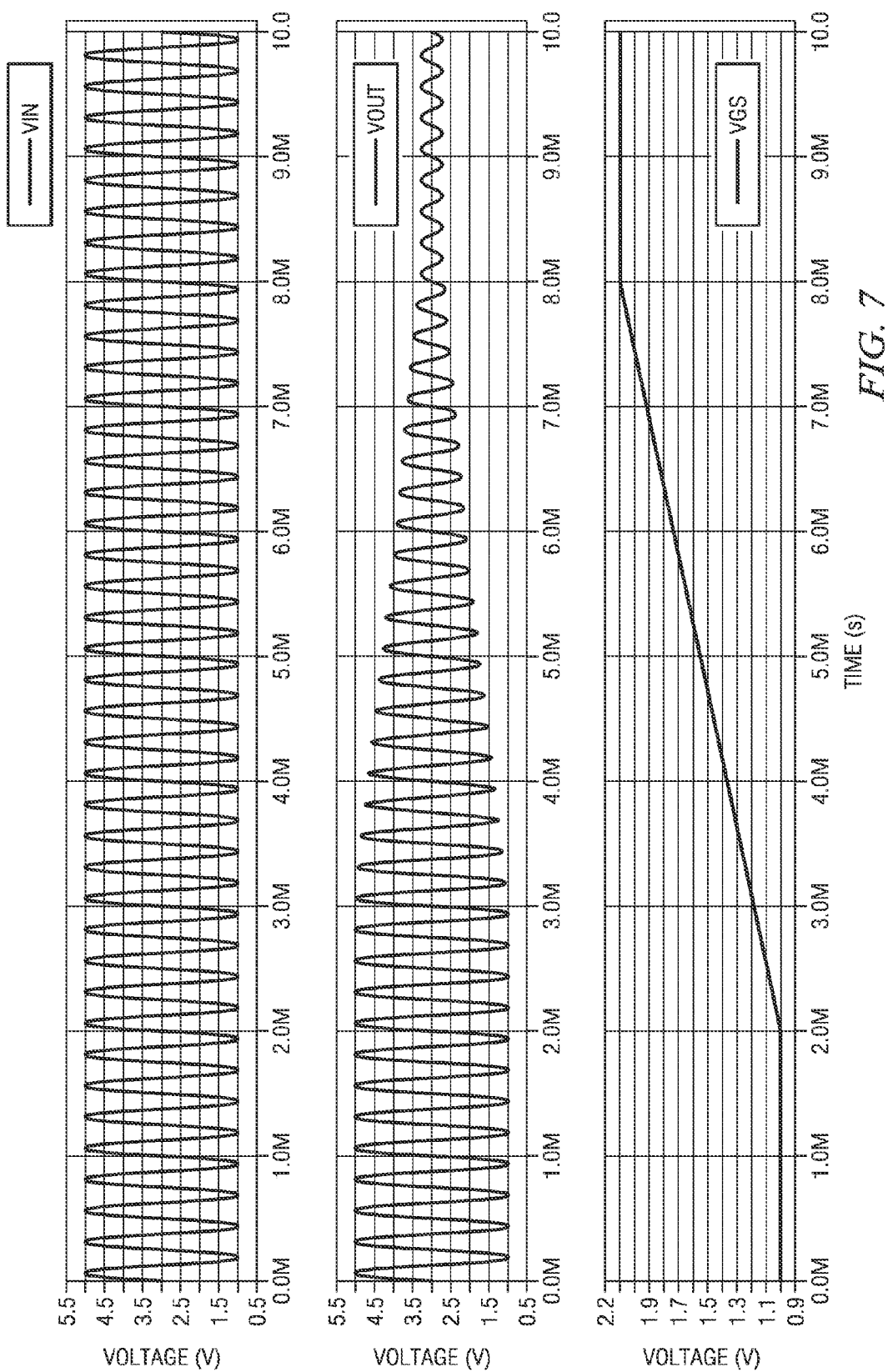
FIG. 7 shows waveforms illustrating operation of the circuit of FIG. 6 as a result of a circuit simulation.

Reference is now made to FIG. 7 which shows waveforms illustrating operation of the circuit of FIG. 6 as a result of a circuit simulation. In FIG. 7, VIN refers to the source signal voltage $V_S$, VOUT refers to the output voltage $V_O$, and VGS refers to the control voltage $V_C$. The input signal, output signal and the control voltage are shown respectively. The output voltage VOUT is the voltage across the proposed variable resistor structure. It can be seen that the output signal shows good linearity all along the control range (with good linearity for both large and small signal level).

Although specific transistor types (bi-polar and MOS) are illustrated in the drawings, it will be understood the any suitable type of transistor could be used, the illustrated transistor types being exemplary only, and all bi-polar or alternatively all MOS designs are possible. Furthermore, any suitable amplification circuitry could be used for the illustrated operational amplifier. Still further, the illustrated resistors may be implemented as transistors having fixed bias control.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:
1. A circuit, comprising:
 a fixed attenuation circuit configured to receive a source signal at a first reference node and output an attenuated source signal;
 an operational amplifier circuit configured to receive the attenuated source signal and a feedback signal and having dual outputs configured to generate a first control signal and a second control signal;
 a first transistor having a control terminal configured to receive the first control signal, a first conduction termi- nal configured to generate an output signal and a second conduction terminal configured to generate the feedback signal;

a second transistor coupled between the second conduction terminal and a second reference node and having a control terminal configured to receive a third control signal; and a third transistor having a control terminal configured to receive the second control signal, the third transistor having a first conduction terminal coupled to the second conduction terminal of the first transistor.

2. The circuit of claim 1, wherein the fixed attenuation circuit is a voltage divider circuit.

3. The circuit of claim 1, further comprising a fixed resistive circuit coupled between the first conduction terminal of the first transistor and the first reference node.

4. The circuit of claim 1, wherein the dual outputs have a level shift therebetween.

5. The circuit of claim 1, wherein the first and third transistors are of opposite conductivity type.

6. The circuit of claim 1, further comprising:
a first current mirror circuit having a first leg coupled to a second conduction terminal of the third transistor and having a second leg; and
a second current mirror circuit having a first leg coupled to the second leg of the first current mirror circuit and having a second leg coupled to the first conduction terminal of the first transistor.

7. A circuit, comprising:
a fixed attenuation circuit coupled between a first reference node and a second reference node that are configured to receive a variable source signal, said attenuation circuit configured to output an attenuated variable source signal;
a fixed resistive circuit;
a variable resistive circuit, wherein the fixed resistive circuit and variable resistive circuit are coupled in series at an output node between the first reference node and the second reference node; and
said variable resistive circuit having a first input configured to receive the attenuated variable source signal and a second input configured to receive a variable resistance control signal and including:
a differential input amplifier circuit having a first input configured to receive the attenuated source signal and having a second input configured to receive a feedback signal and having dual outputs comprising a first signal and a second signal;
a first transistor having a control terminal configured to receive the first signal, a first conduction terminal coupled to the output node and a second conduction terminal;
a second transistor having a control terminal configured to receive the variable resistance control signal, a first conduction terminal coupled to the second conduction terminal of the first transistor and a second conduction terminal coupled to the second reference node; and
a third transistor having a control terminal configured to receive the second signal, a first conduction terminal coupled to the second conduction terminal of the first transistor and a second conduction terminal coupled to the second reference node.

8. The circuit of claim 7, wherein the fixed attenuation circuit is a voltage divider circuit.

9. The circuit of claim 7, wherein the dual outputs have a level shift therebetween.

10. The circuit of claim 7, wherein the first and third transistors are of opposite conductivity type.

11. The circuit of claim 7, further comprising:
a first current mirror circuit having a first leg coupled between the second conduction terminal of the third transistor and the second reference node and further having a second leg; and
a second current mirror circuit having a first leg coupled to the second leg of the first current mirror circuit and having a second leg coupled to the output node.

12. A circuit, comprising:
first and second reference nodes across which a variable source signal is to be applied;
a first resistor;
a second resistor;
wherein the first and second resistors are connected in series at a first node between the first and second reference nodes;
an operational amplifier having a first input connected to the first node and a second input connected to a feedback node;
a third resistor connected between the first reference node and an output node;
a first transistor having first control terminal coupled to an output of the operational amplifier and having a first conduction terminal connected to the output node and having a second conduction terminal connected to the feedback node;
a second transistor having a second control terminal configured to receive a variable resistance control signal and having a first conduction terminal connected to the feedback node and a second conduction terminal connected to the second reference node; and
a third transistor having a third control terminal coupled to the output of the operational amplifier and having a first conduction terminal connected to the feedback node and further having a second conduction terminal connected to the second reference node.

13. The circuit of claim 12, wherein the first transistor is a bi-polar transistor and the second transistor is a MOS transistor.

14. The circuit of claim 12, wherein the operational amplifier circuit is configured to generate dual outputs with a level shift therebetween comprising a first signal and a second signal, wherein the first signal is applied to the first control terminal of the first transistor and the second signal is applied to the third control terminal of the third transistor.

15. The circuit of claim 12, further comprising:
a first current mirror circuit having an input connected to the second conduction terminal of the third transistor; and
a second current mirror circuit having an input connected to an output of the first current mirror, the second current mirror circuit further having an output connected to the output node.

16. The circuit of claim 12, wherein the first and third transistors are of opposite conductivity type.

* * * * *